(12) United States Patent
Brown

(10) Patent No.: US 7,429,837 B2
(45) Date of Patent: Sep. 30, 2008

(54) APPARATUS AND METHOD OF DRIVING A LIGHT POWERED SYSTEM

(76) Inventor: Fred A. Brown, 55 Delaport Pl., Coronado, CA (US) 92118

( * ) Notice: Subject to any disclaimer, the term of this patent is extended or adjusted under 35 U.S.C. 154(b) by 0 days.

(21) Appl. No.: 11/021,719

(22) Filed: Dec. 23, 2004

(65) Prior Publication Data

US 2006/0138976 A1    Jun. 29, 2006

(51) Int. Cl.
    *H02P 1/54*    (2006.01)
    *H02P 5/00*    (2006.01)
    *H02P 5/46*    (2006.01)
(52) U.S. Cl. ..................................................... 318/105
(58) Field of Classification Search ................. 318/432, 318/434, 599, 811, 105
    See application file for complete search history.

(56) References Cited

U.S. PATENT DOCUMENTS

| | | | |
|---|---|---|---|
| 4,494,180 A * | 1/1985 | Streater et al. ................. | 363/37 |
| 5,237,263 A | 8/1993 | Gannon ....................... | 323/288 |
| 5,520,359 A * | 5/1996 | Merhav et al. ........... | 244/172.7 |
| 5,731,676 A | 3/1998 | Nakamats ..................... | 318/471 |
| 5,760,572 A | 6/1998 | Takeda et al. ................ | 323/288 |
| 6,426,601 B1 * | 7/2002 | De Filippis et al. ......... | 318/139 |
| 6,812,662 B1 * | 11/2004 | Walker ....................... | 318/280 |
| 2003/0169006 A1 | 9/2003 | Allen .......................... | 318/442 |
| 2005/0116671 A1 * | 6/2005 | Minami et al. .............. | 318/275 |

FOREIGN PATENT DOCUMENTS

| | | |
|---|---|---|
| JP | 56-112804 | 9/1981 |
| JP | 1-103791 | 4/1989 |
| JP | 5-3628 | 1/1993 |
| JP | 5-223397 | 8/1993 |
| JP | 10-77611 | 3/1998 |

* cited by examiner

*Primary Examiner*—Lincoln Donovan
*Assistant Examiner*—Erick Glass

(57) ABSTRACT

A motor has a controller that controls the amount of power drawn by motor drive circuitry as a function of the light conversion panels in the system. To that end, the motor also has an input (operatively coupled with the controller) that is couplable with a set of light conversion panels (the set may range from no panels to a plurality of panels). The controller is configured to 1) determine the total number of light conversion panels in the set and 2) control the amount of power drawn by the drive circuitry as a function of the number of light conversion panels in the set.

29 Claims, 3 Drawing Sheets

APPARATUS AND METHOD OF DRIVING A LIGHT POWERED SYSTEM

FIELD OF THE INVENTION

The invention generally relates to light powered devices and, more particularly, the invention relates to controlling power draw from light panels powering electrical systems.

BACKGROUND OF THE INVENTION

Fossil fuels are in short supply and harm the environment. Accordingly, there is a growing movement toward using renewable, environmentally friendly energy sources. One such promising technology harnesses energy from light sources, such as the sun. To do so, a light conversion panel (e.g., a solar panel) converts received light rays to electrical energy. This converted electrical energy can power any number of widely used electrically powered devices, such as calculators, household appliances, or electric motors.

An electrically powered device can damage its corresponding light conversion panel(s), however, if it attempts to draw too much power from the panel(s). For example, a motor can damage its coupled light conversion panel it attempts to draw more power than the panel rated power. To avoid this problem, system designers typically match the electrical device with the rated power of the panel. For example, if each panel in an array of five panels has a rated power of two watts, then the system designer may select a corresponding motor having a power draw of no more than ten watts. In fact, to further protect against possible malfunctions, the system designer may select a motor that draws no more than nine watts.

This matching process works well as long as no light conversion panels are added to or removed from the system. Specifically, if one or more of an array of light conversion panels malfunctions, then the matched motor may draw too much power from the remaining panels. Consequently, the motor may damage the remaining panels because it is drawing too much power from them. This also can happen if one or more of the array of solar panels are physically removed.

Other problems arise when more panels are added to an existing system. In particular, if one or more panels are added to an array of panels, then such a system does not operate efficiently—the maximum speed does not increase in a proportional manner. The system therefore does not effectively utilize the extra capacity of the additional panel.

SUMMARY OF THE INVENTION

In accordance with one aspect of the invention, a motor has a controller that controls the amount of power drawn by motor drive circuitry as a function of the light conversion panels in the system. To that end, the motor also has an input (operatively coupled with the controller) that is couplable with a set of light conversion panels (the set may range from no panels to a plurality of panels). The controller is configured to 1) determine the total number of light conversion panels in the set and 2) control the amount of power drawn by the drive circuitry as a function of the number of light conversion panels in the set.

In some embodiments, the controller is coupled with the set of light conversion panels. Such a coupling may be a removable connection or a permanent connection. Moreover, the controller may be configured to detect a voltage delivered by the set of light conversion panels. In response, the controller can determine the total number of light conversion panels in the set as a function of the detected voltage. Among other ways, the controller may control a pulse width modulated current to the drive circuitry as a function of the total number of light conversion panels in the set. In addition, the controller may control the drive circuitry as a direct linear function of the total number of light conversion panels in the set.

The motor may be a part of an air moving device and thus, include a rotor having an impeller or propeller. Accordingly, in such case, the drive circuitry controls rotation of the rotor. In yet other embodiments, the controller may have a microprocessor executing program code. Each light conversion panel in the set may have a rated maximum power. The controller thus may control the drive circuitry to draw no more than the rated maximum power by each light conversion panel in the set of light conversion panels.

In accordance with another aspect of the invention, a system has a motor with a controller operatively coupled with drive circuitry. The controller controls the amount of power drawn by the drive circuitry. The system also has a set of light conversion panels operatively coupled with the controller. The controller is configured to determine the total number of light conversion panels in the set. The controller thus controls the amount of power drawn by the drive circuitry as a function of the number of light conversion panels in the set.

In accordance with other aspects of the invention, a method provides drive circuitry for controlling rotation of a rotor in a motor. A set of light conversion panels is coupled with the drive circuitry. The method determines the total number of light conversion panels coupled with the drive circuitry, and dynamically controls the drive circuitry to draw power from the set of light conversion panels as a function of the total number of light conversion panels in the set.

In some embodiments, the method removes one of the set of light conversion panels. In such case, the method controls the drive circuitry to reduce the power delivered to the drive circuitry. Moreover, to determine the total number of panels, the method may receive a signal having a quality indicating the total number of light conversion panels in the set.

In accordance with another aspect of the invention, a light powered system has a controller that controls the amount of power drawn by power circuitry as a function of the light conversion panels in the system. To that end, the system also has an input (operatively coupled with the controller) that is couplable with a set of light conversion panels (the set may range from no panels to a plurality of panels). The controller is configured to 1) determine the total number of light conversion panels in the set and 2) control the amount of power drawn by the power circuitry as a function of the number of light conversion panels in the set.

The light powered system may include, among other things, an electric motor.

Illustrative embodiments of the invention are implemented as a computer program product having a computer usable medium with computer readable program code thereon. The computer readable code may be read and utilized by a computer system in accordance with conventional processes.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

In illustrative embodiments of the invention, a light powered electrical system has a controller that determines the total number of light conversion panels coupled to its resident electrical device. The controller then controls the current draw by the electrical device as a function of the total number of coupled light conversion panels. Accordingly, the system can run at a high efficiency while minimizing the risk of damaging the panels. Details of various embodiments are discussed below.

Figure 1:
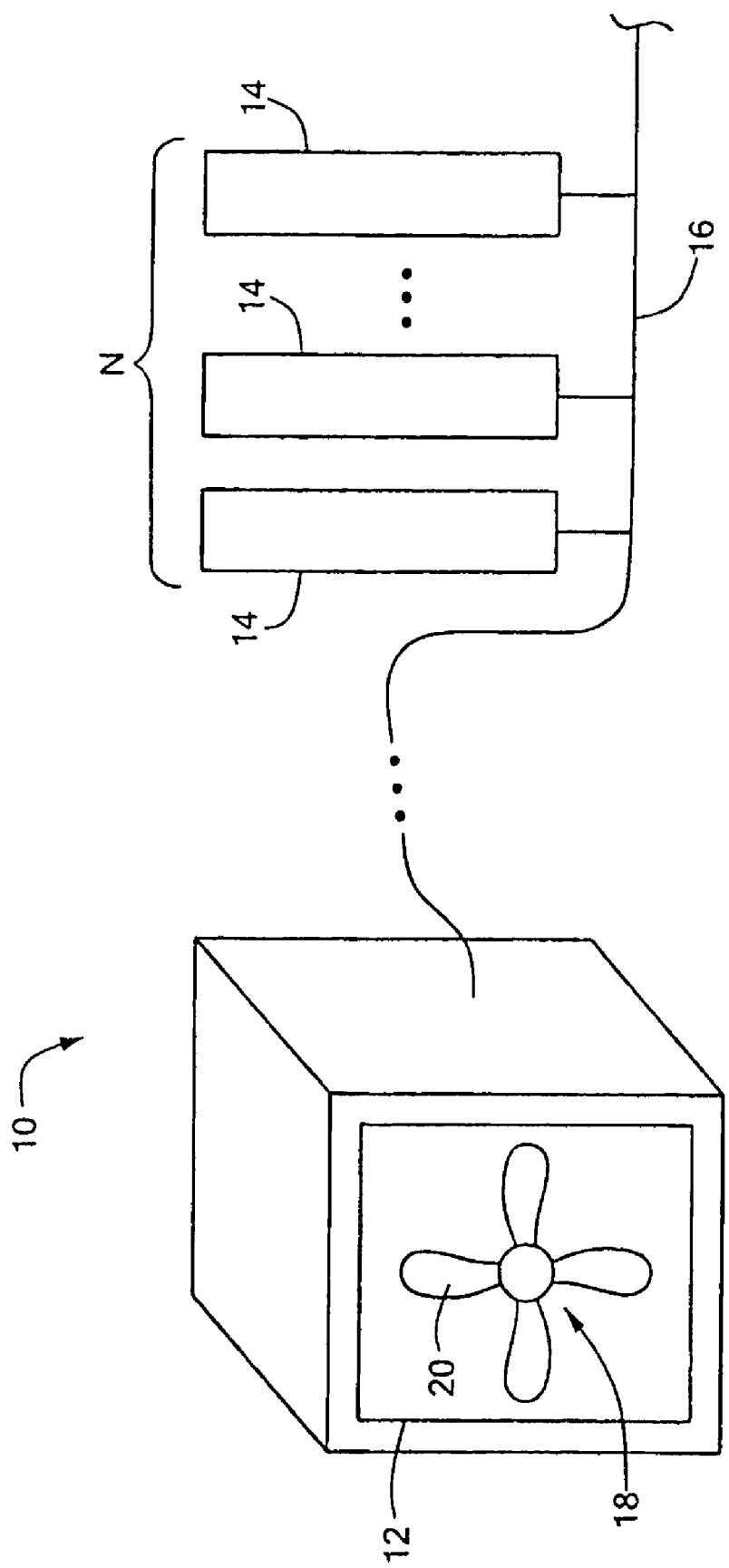
FIG. 1 schematically shows a light powered electronic device system that may be configured in accordance with illustrative embodiments of the invention.

FIG. 1 schematically shows a system 10 that may be configured in accordance with illustrative embodiments. The system 10 has a fan 12 that draws power from a set of "N" light conversion panels (hereinafter, "panels 14"). The panels 14 are coupled with a wire set 16 that permits communication with the fan 12.

The fan 12 may have many of the same components as those commonly in conventional fans. For example, the fan 12 includes an electric motor (DC or AC) having a stator that rotates a rotor 18 at a prescribed rotational speed. The rotor 18 has a propeller or impeller (both identified by reference number 20) to move air in the desired manner. Internal electronics, discussed with regard to FIGS. 2 and 3, receive power from the set of panels 14 and cause the rotor 18 to rotate in a controlled manner. It should be noted, however, that a fan is discussed for exemplary purposes only. Various embodiments apply to other electrical devices, such as household power systems.

In illustrative embodiments, the light conversion panels 14 are solar panels. It nevertheless should be noted, however, that various embodiments are not limited to solar panels. Other panels that convert light (from any source) to electricity is within the scope of various embodiments. In a similar manner, the total number of panels 14 in the set can range from no panels 14 to some plural number of panels 14. Those skilled in the art can determine an appropriate number for a given application. Of course, if no panels 14 are in the set, then the system 10 cannot operate (absent some other power source).

Figure 2:
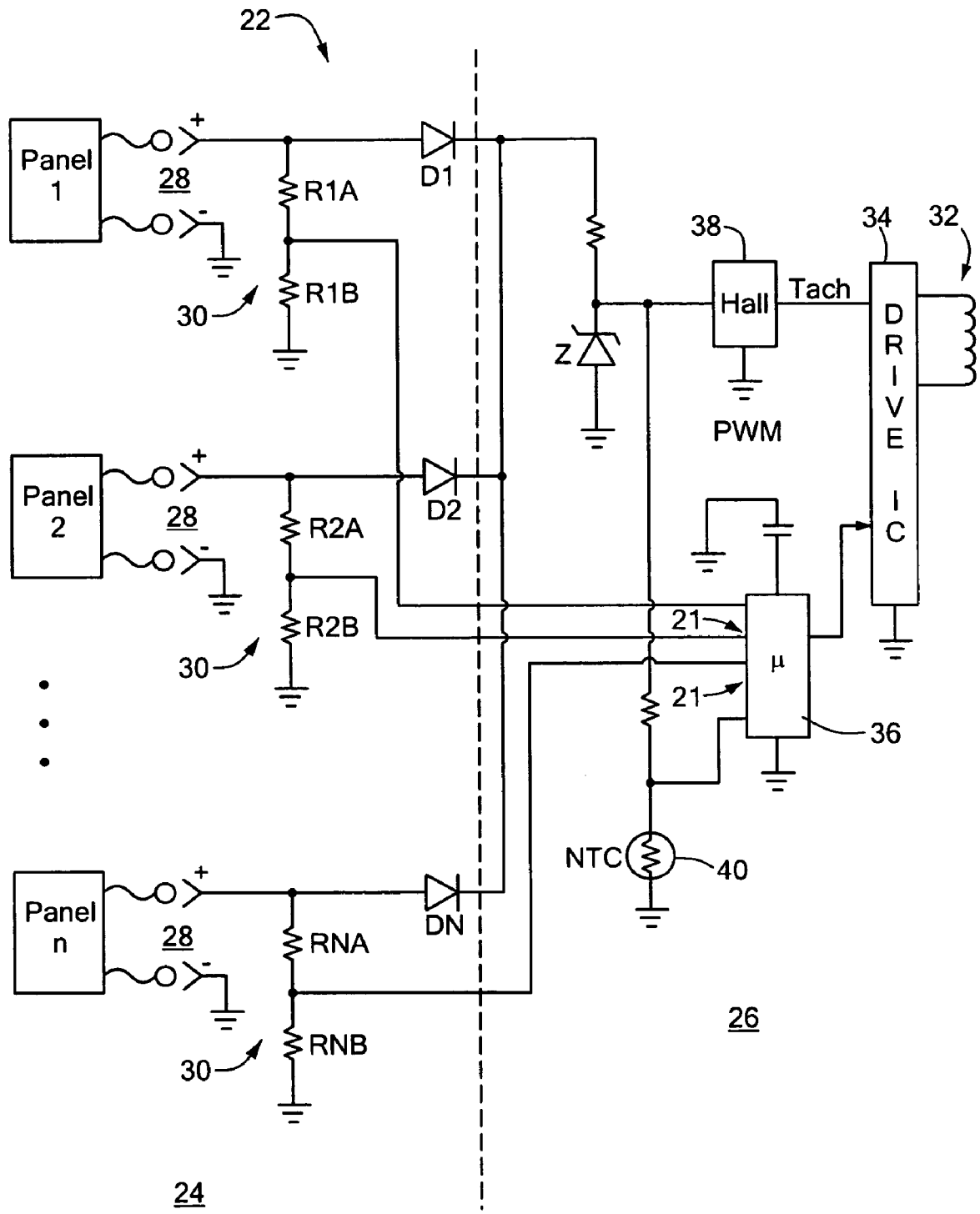
FIG. 2 schematically shows a circuit diagram of a motor control system configured in accordance with illustrative embodiments of the invention.

FIG. 2 schematically shows a circuit diagram of a motor circuit 22 configured in accordance with illustrative embodiments of the invention. The circuit 22 has an input stage 24 for receiving power from the set of panels 14, and a drive stage 26 for controllably driving the rotor 18.

To those ends, the input stage 24 has a plurality of N input ports 28 for receiving power from each of the N panels 14, and current protect diodes D1-D3 for preventing reverse current conditions. The input stage 24 also has a plurality of voltage divider circuits 30 formed by pairs of resistors. As discussed in greater detail below, each voltage divider circuit 30 delivers a voltage to the drive stage 26 indicating whether a panel 14 is connected to its corresponding input. For example, the voltage divider from resistors R1A and R1B deliver the noted voltage to the drive stage 26 when a panel 14 is coupled with the first input port 28. As shown in FIG. 2, resistors R1A and R1B form the first voltage divider circuit 30, resistors R2A and R2B form the second voltage divider circuit 30, and resistors RNA and RNB form the Nth voltage divider circuit 30.

As its name suggests, the drive stage 26 produces a switched electromagnetic field that causes the rotor 18 to rotate. To that end, the drive stage 26 has motor windings 32 for producing a changing magnetic field in response to drive signals received from a drive integrated circuit ("driver 34"), and a controller microprocessor ("controller 36") for controlling the power drawn by the drive integrated circuit as a function of the number of panels 14 in the set. In illustrative embodiments, the driver 34 is an INFINEON model number TLE6209R drive integrated circuit, distributed by Infineon Technologies AG of Munich, Germany. Also in illustrative embodiments, the controller 36 may be a PIC microprocessor, such as a model number 16F818 PIC processor from Microchip Technology Incorporated of Chandler, Ariz. Details of the cooperation of the controller 36 and driver 34 are discussed below.

The drive stage 26 also has a Hall effect sensor 38 for detecting the rotational speed of the rotor 18, and a negative temperature coefficient device 40 for shutting down the entire system 10 if the detected temperature is below a certain value. The negative temperature coefficient device 40 improves efficiency because it ensures that the fan 12 will not operate when it is not needed, such as when the temperature below some predetermined temperature.

To maintain the input voltage of the controller 36 and driver electronics at a predetermined voltage level (e.g., 5 volts), the drive stage 26 also has a Zener diode Z. This voltage is the intended operating voltage of the electronics within those devices. Such voltage does not, however, affect the total amount of current or drive voltage drawn by the driver 34 for producing the changing magnetic field. Accordingly, the driver 34 can draw as much current and voltage from the panels 14 as they permit. As discussed below, the controller 36 reduces this voltage to a level that should not compromise the integrity of the panels 14.

In particular, as noted above, the controller 36 detects the total number of panels 14 coupled within the system 10 and dynamically controls the driver 34 to draw no greater than a predetermined amount of power that does not compromise their operation. This process may be continually performed while the system 10 is operating. Accordingly, if one panel 14 malfunctions, the controller 36 detects its malfunction and causes the driver 34 to draw less power. Conversely, if an additional panel 14 is added to the system 10, then the controller 36 causes the driver 34 to draw more power, if it is able to, from the panels 14.

Figure 3:
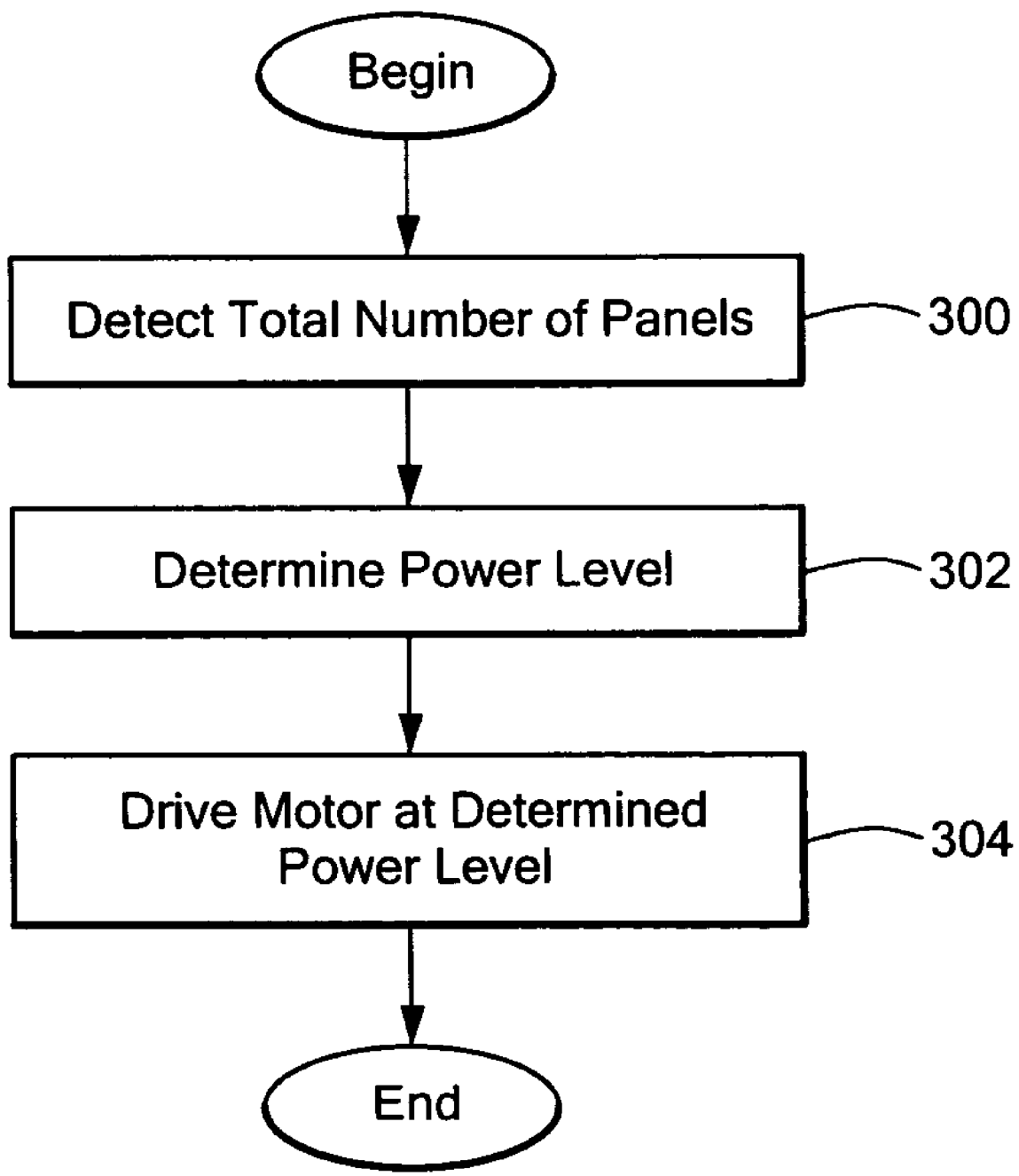
FIG. 3 shows a process of controlling energization of an electric motor in accordance with illustrative embodiments of the invention.

FIG. 3 shows a process for controlling the driver 34 in accordance with illustrative embodiments of the invention. The process begins at step 300, in which the controller 36 determines the total number of panels 14 coupled with the system 10. To that end, the controller 36 has a plurality of detection ports 21 that each are electrically coupled with one of the input ports 28. If a panel 14 is coupled with any one of those input ports 28, then its voltage divider generates a voltage that is received in its corresponding controller detection port. For example, if panel 14 is coupled to the second port, then it should produce a voltage across resistor R2B (if light illuminates it). That voltage then is detected by a detection port in the controller 36, which indicates that the second panel 14 is coupled to the system 10. Such a voltage illustratively may be on the order of about five volts. Accordingly, receipt of the five volts acts a logical "on" signal to indicate that the second panel 14 is coupled with the system 10. The controller 36 thus simply determines how many detection ports 21 are receiving this logical on signal.

In alternative embodiments, the detection ports 21 can detect other types of signals for determining the presence of the panels 14. For example, a current signal may be used. In fact, in some embodiments, a single detection port could be used to detect a signal indicating the total number of panels 14 coupled with the system 10. Moreover, the panels 14 do not necessarily have to be at any specific input port 28 or in any specific order to be detected; coupling them to any input port 28 should suffice.

After the total number of panels 14 is determined, the process continues to step 302, in which the controller 36 determines an appropriate power level for driving the driver 34. To that end, the controller 36 uses preprogrammed information relating to the rated maximum power of each of the panels 14 to determine the amount of power/current that the driver 34 may draw. Among other ways, the controller 36 may multiply the total number of coupled panels 14 with the rated power of each panel. For example, if the detect ports 21 detect three panels 14 with a rated maximum power of ten watts, then the controller 36 ensures that the driver 34 draws no more than thirty watts of power from the panels 14. The controller 36 thus controls the driver 34, in this embodiment, to draw current as a direct linear function of the total number of panels 14 coupled with the system 10.

As noted above, however, absent intervention from the controller 36, the driver 34 may attempt to draw much more power from the panels 14. Specifically, the driver 34 is in parallel with the total voltage from the panels 14 in the set/array and a resistance substantially equal to the winding 32. The quotient of the total voltage and this resistance (i.e., total voltage/resistance) equals the maximum current the driver 34 may draw. If the motor is large enough, this may be a relatively large current. If drawn, such a large current could damage the panels 14. The driver 34 thus protects against this result by preventing such a large current draw.

To that end, the process continues to step 304, in which the controller 36 drives the driver 34 at a power level that is no greater than that determined at step 302. Specifically, in illustrative embodiments, the controller 36 generates and transmits a pulse width modulated signal at a specific frequency and duty cycle to a control input in the driver 34. This control input effectively turns the driver 34 on and off via a pulse width modulation process to reduce the effective voltage received by the driver 34 to that determined by step 302. Consequently, the driver 34 draws less current from the panels 14, thus completing the process.

In illustrative embodiments, the controller 36 causes the driver 34 to draw less than the product of the maximum rated power and the total number of panels 14. For example, the controller 36 may to ensure that the total draw is about 90 percent of the product of the maximum rated power and the total number of panels 14. This further reduces the likelihood that the panels 14 could be damaged by being overdrawn.

As noted above, this process illustratively operates continually during motor operation. If no panels 14 are coupled with the system 10, neither the controller 36 nor the driver 34 can operate (absent some other power source). Connection of one or more panels 14 thus energizes both the controller 36 and driver 34, thus beginning the process. In alternative embodiments, the process of FIG. 3 may operate at some intermittent time interval(s).

In alternative embodiments, rather than calculating a power level (at step 302), the controller 36 to check a look up table. Specifically, among other things, the look up table may have power levels indexed to total numbers of panels 14 detected in the system 10, or power levels indexed to detected voltages at the detect inputs. In still other embodiments, the system 10 may have a graphical user interface that enables a user to program the controller 36. For example, the rated power values may be reprogrammed, or the motor parameters may be reprogrammed.

Accordingly, when in use, the controller 36 continually monitors the total number of panels 14 in the system 10, and controls power drawn by the driver 34. If an additional panel 14 is added, then power draw can be increased up to the limits of the driver 34. In some embodiments, the input ports 28 are configured to removably receive the panels 14. Connected panels 14 thus can be freely removed and added to the system 10. In other embodiments, the input ports 28 are configured to have a permanent connection with the panels 14.

The system 10 thus enables flexibility of producing a system having a wider range of power levels. Specifically, a relatively powerful motor can be used with a system that initially does not need such power. If a future need arises to increase system power, more panels 14 can be added without replacing the motor. The relationship between the motor power and the panels 14 thus can be matched to permit a wide range of uses.

Various embodiments of the invention may be implemented at least in part in any conventional computer programming language. For example, some embodiments may be implemented in a procedural programming language (e.g., "C"), or in an object oriented programming language (e.g., "C++"). Other embodiments of the invention may be implemented as preprogrammed hardware elements (e.g., application specific integrated circuits, FPGAs, and digital signal processors), or other related components.

The disclosed apparatus and method may be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

Although various exemplary embodiments of the invention have been disclosed, it should be apparent to those skilled in the art that various changes and modifications can be made that will achieve some of the advantages of the invention without departing from the true scope of the invention.

What is claimed is:

1. A motor comprising:
   drive circuitry;
   a controller operatively coupled with the drive circuitry, the controller controlling the amount of power drawn by the drive circuitry; and
   an input operatively coupled with the controller, the input being couplable with a set of light conversion panels,
   the controller configured to determine the total number of light conversion panels in the set and including a microprocessor executing program code,
   the controller controlling the amount of power drawn by the drive circuitry as a function of the number of light conversion panels in the set.

2. The motor as defined by claim 1 wherein the controller is coupled with the set of light conversion panels.

3. The motor as defined by claim 1 wherein the controller is configured to detect a voltage delivered by the set of light conversion panels, the controller determining the total number of light conversion panels in the set as a function of the detected voltage.

4. The motor as defined by claim 1 wherein the controller controls a pulse width modulated current to the drive circuitry as a function of the total number of light conversion panels in the set.

5. The motor as defined by claim 1 wherein the controller controls the drive circuitry as a direct linear function of the total number of light conversion panels in the set.

6. The motor as defined by claim 1 further comprising a rotor having an impeller or propeller, the drive circuitry controlling rotation of the rotor.

7. The motor as defined by claim 1 wherein the input includes means for removably coupling with the set of light conversion panels.

8. The motor as defined by claim 1 wherein each light conversion panel in the set has a rated maximum power, the controller controlling the drive circuitry to draw no more than the rated maximum power by each light conversion panel in the set of light conversion panels.

9. The motor as defined by claim 1 wherein the light conversion panels include a solar panel.

10. A system comprising:
    a motor having a controller operatively coupled with drive circuitry, the controller controlling the amount of power drawn by the drive circuitry;
    a set of light conversion panels operatively coupled with the controller,
    the controller configured to determine the total number of light conversion panels in the set, the controller controlling the amount of power drawn by the drive circuitry as a function of the number of light conversion panels in the set and including a microprocessor executing program code.

11. The system as defined by claim 10 wherein the motor has a rotor with a coupled impeller or propeller, the drive circuitry controlling rotation of the rotor.

12. The system as defined by claim 10 wherein each of the set of light conversion panels has a rated maximum power, the controller controlling the drive circuitry to draw no more than the rated maximum power from each light conversion panel in the set of light conversion panels.

13. The motor as defined by claim 10 wherein the controller is configured to detect a voltage delivered by the set of light conversion panels, the controller determining the total number of light conversion panels in the set as a function of the detected voltage.

14. The motor as defined by claim 10 wherein the controller controls a pulse width modulated current to the drive circuitry as a function of the total number of light conversion panels in the set.

15. The motor as defined by claim 10 wherein the controller controls the drive circuitry as a direct linear function of the total number of light conversion panels in the set.

16. A method comprising:
    providing drive circuitry for controlling rotation of a rotor in a motor, a set of light conversion panels being coupled with the drive circuitry;
    providing a controller having a microprocessor executing program code;
    determining the total number of light conversion panels coupled with the drive circuitry; and
    dynamically controlling the drive circuitry with the controller to draw power from the set of light conversion panels as a function of the total number of light conversion panels in the set.

17. The method as defined by claim 16 wherein controlling includes:
    determining the rated maximum power of each light conversion panel in the set; and
    controlling the drive circuitry to draw no more than the rated maximum power from each light conversion panel in the set of light conversion panels.

18. The method as defined by claim 16 wherein controlling comprises controlling the drive circuitry as a direct linear function of the total number of solar panels in the set.

19. The method as defined by claim 16 wherein controlling comprises controlling a pulse width modulated current to the drive circuitry as a function of the total number of light conversion panels in the set.

20. The method as defined by claim 16 further comprising removing one of the set of light conversion panels, controlling further including reducing the power delivered to the drive circuitry.

21. The method as defined by claim 16 wherein determining includes receiving a signal having a quality, the quality indicating the total number of light conversion panels in the set.

22. A light powered system comprising:
    power circuitry;
    a controller operatively coupled with the drive circuitry, the controller controlling the amount of power drawn by the power circuitry; and
    an input operatively coupled with the controller, the input being couplable with a set of light conversion panels,
    the controller configured to determine the total number of light conversion panels in the set and including a microprocessor executing program code,
    the controller controlling the amount of power drawn by the power circuitry as a function of the number of light conversion panels in the set.

23. The system as defined by claim 22 wherein the power circuitry is drive circuitry of an electric motor.

24. A motor comprising:
    drive circuitry;
    a controller operatively coupled with the drive circuitry, the controller controlling the amount of power drawn by the drive circuitry; and
    an input operatively coupled with the controller, the input being couplable with a set of light conversion panels, the controller configured to determine the total number of light conversion panels in the set, the controller controlling the amount of power drawn by the drive circuitry as a function of the number of light conversion panels in the set.

25. The motor as defined by claim 24 wherein the controller is coupled with the set of light conversion panels.

26. The motor as defined by claim 24 wherein the controller is configured to detect a voltage delivered by the set of light conversion panels, the controller determining the total number of light conversion panels in the set as a function of the detected voltage.

27. The motor as defined by claim 24 wherein the controller controls a pulse width modulated current to the drive circuitry as a function of the total number of light conversion panels in the set.

28. The motor as defined by claim 24 wherein each light conversion panel in the set has a rated maximum power, the controller controlling the drive circuitry to draw no more than the rated maximum power by each light conversion panel in the set of light conversion panels.

29. The motor as defined by claim 24 wherein the light conversion panels include a solar panel.

* * * * *